United States Patent
Shimizu et al.

(10) Patent No.: US 8,151,814 B2
(45) Date of Patent: Apr. 10, 2012

(54) METHOD FOR CONTROLLING FLOW AND CONCENTRATION OF LIQUID PRECURSOR

(75) Inventors: Akira Shimizu, Sagamihara (JP); Akiko Kobayashi, Tokyo (JP); Hiroki Kanayama, Nagaoka (JP)

(73) Assignee: ASM Japan K.K. (JP)

( * ) Notice: Subject to any disclaimer, the term of this patent is extended or adjusted under 35 U.S.C. 154(b) by 611 days.

(21) Appl. No.: 12/353,076

(22) Filed: Jan. 13, 2009

(65) Prior Publication Data
US 2010/0178423 A1    Jul. 15, 2010

(51) Int. Cl.
*F17D 1/17* (2006.01)
*C23C 16/448* (2006.01)

(52) U.S. Cl. .......... 137/14; 427/248.1; 427/255.28; 118/692; 118/715; 118/726; 118/50

(58) Field of Classification Search .......... 137/12, 137/14, 82, 84; 117/726; 427/248.1, 255.28; 118/692, 715, 726, 50
See application file for complete search history.

(56) References Cited

U.S. PATENT DOCUMENTS

| | | | |
|---|---|---|---|
| 4,436,674 A | 3/1984 | McMenamin | |
| 4,479,845 A | 10/1984 | Nisizawa et al. | |
| 4,676,404 A | 6/1987 | Yamazaki et al. | |
| 4,783,343 A * | 11/1988 | Sato | 427/8 |
| 4,859,375 A | 8/1989 | Lipisko et al. | |
| 4,911,101 A * | 3/1990 | Ballingall et al. | 118/715 |
| 4,979,545 A | 12/1990 | Fair | |
| 4,979,643 A | 12/1990 | Lipisko et al. | |
| 5,038,840 A | 8/1991 | Fair | |
| 5,069,244 A | 12/1991 | Miyazaki et al. | |
| 5,148,945 A | 9/1992 | Geatz | |
| 5,153,837 A | 10/1992 | Shaffer et al. | |
| 5,288,325 A * | 2/1994 | Gomi | 118/692 |
| 5,399,881 A | 3/1995 | Bozovic et al. | |
| 5,417,235 A * | 5/1995 | Wise et al. | 137/1 |
| 5,586,039 A | 12/1996 | Hirsch et al. | |
| 5,586,059 A | 12/1996 | Oshelski et al. | |
| 5,711,354 A | 1/1998 | Siegele et al. | |
| 5,757,673 A | 5/1998 | Osheiski et al. | |
| 5,801,961 A | 9/1998 | Moore et al. | |
| 5,803,938 A * | 9/1998 | Yamaguchi et al. | 261/130 |

(Continued)

FOREIGN PATENT DOCUMENTS
WO    WO 01/46761 A2    6/2001

OTHER PUBLICATIONS
Reath, M. et al., *Use of Residual Gas Analysis in Low Pressure Semiconductor Process Reactors*, Proceedings-Institute of Environmental Sciences 1993, 39th (vol. 1), 119-123.

(Continued)

*Primary Examiner* — Jason L. Lazorcik
(74) *Attorney, Agent, or Firm* — Knobbe Martens Olson & Bear LLP

(57) ABSTRACT

A method for controlling flow and concentration of a liquid precursor includes: supplying a carrier gas to a first auto-pressure regulator and outputting therefrom the carrier gas at a first pressure to a precursor reservoir; outputting the mixture of the vaporized precursor and the carrier gas from the precursor reservoir; and supplying the mixture to a second auto-pressure regulator and outputting therefrom the mixture at a second pressure to a reactor via an orifice.

14 Claims, 6 Drawing Sheets

U.S. PATENT DOCUMENTS

| | | | |
|---|---|---|---|
| 6,038,919 A * | 3/2000 | Schmitt et al. | 73/149 |
| 6,228,563 B1 | 5/2001 | Starov et al. | |
| 6,264,064 B1 | 7/2001 | Birtcher et al. | |
| 6,287,965 B1 | 9/2001 | Kang et al. | |
| 6,368,975 B1 | 4/2002 | Balasubramhanya et al. | |
| 6,408,220 B1 | 6/2002 | Nulman | |
| 6,496,200 B1 | 12/2002 | Snibbe et al. | |
| 6,613,383 B1 | 9/2003 | George et al. | |
| 6,660,660 B2 | 12/2003 | Haukka et al. | |
| 6,699,524 B2 * | 3/2004 | Kesala | 427/248.1 |
| 6,779,378 B2 * | 8/2004 | Bondestam | 73/19.05 |
| 7,063,981 B2 | 6/2006 | Bondestram et al. | |
| 7,156,380 B2 * | 1/2007 | Soininen | 261/122.1 |
| 7,335,396 B2 * | 2/2008 | Carpenter et al. | 427/248.1 |
| 7,374,941 B2 | 5/2008 | Bondestam et al. | |
| 7,601,225 B2 * | 10/2009 | Tuominen et al. | 118/726 |
| 7,628,860 B2 * | 12/2009 | Shajii et al. | 118/666 |
| 7,628,861 B2 * | 12/2009 | Clark | 118/666 |
| 7,971,861 B2 * | 7/2011 | Soininen | 261/122.1 |
| 8,047,510 B2 * | 11/2011 | Hirata et al. | 261/129 |
| 2001/0039462 A1 | 11/2001 | Mendez et al. | |
| 2002/0014275 A1 | 2/2002 | Blatt et al. | |
| 2002/0017534 A1 | 2/2002 | Soberunie et al. | |
| 2002/0055801 A1 | 5/2002 | Reiss et al. | |
| 2002/0072162 A1 | 6/2002 | Dor et al. | |
| 2002/0156548 A1 | 10/2002 | Arackaparambil et al. | |
| 2004/0124131 A1 * | 7/2004 | Aitchison et al. | 210/252 |
| 2004/0188866 A1 * | 9/2004 | Sivaramakrishnan et al. | 261/62 |
| 2005/0221004 A1 * | 10/2005 | Kilpela et al. | 427/248.1 |
| 2006/0107898 A1 | 5/2006 | Blomberg | |
| 2007/0269596 A1 | 11/2007 | Shero et al. | |
| 2010/0285206 A1 * | 11/2010 | Woelk et al. | 427/8 |

OTHER PUBLICATIONS

Tedder, L.L. et al., *Dynamic rate and thickness metrology during poly-Si rapid thermal chemical vapor deposition from $SiH_4$ using real time in situ mass spectrometry*, Journal of Vacuum Science & Technology, A 1996, 14, 267-270.

Gevelber, M. et al., *Modeling TiN Deposition for Control of CVD*, Proceedings-Electrochemical Society 1996, 96-5, 157-162.

Weerts, W.L.M. et al., *The adsorption of silane, disilane and trisilane on polycrystalline silicon: a transient kinetic study*, Surface Science 1996, 367, 321-339.

Gruia, M. et al., *Utilisation Simultanee D'un Microcalorimetre a Flux De Chaleur et D'un Reacteur Dynamique Ou Pulse Pour L'etude De L'adsorption Ou De Reactions De Catalyse Heterogene*, Journal de Chimie Physique et de Physico-Chimie Biologique 1976, 73 634-640.

Dean, J.W. et al., *An Ambient-Pressure Pulse Microreactor with Continuous Thermogravimetric and On-line Chromatographic Analyses for Catalytic Cracking*, Industrial & Engineering Chemistry Research 1988, 27, 1754-1759.

Desai, N.S. et al., *Interpretation of Data From a Pulse Reactor*, AIChE Symposium Series 1988, 84 , 73-79.

Lang, X. S. et al., *Selectivity Improvement Using Alternate Flushing and Reactant Cycle Steps*, Canadian Journal of Chemical Engineering 1991, 69, 1121-1125.

Yu, M.L. et al., *Surface Chemistry of CVD Reactions Studied by Molecular Beam/Surface Scattering*, Materials Research Society Symposium Proceedings 1991, 204, 37-46.

Davies, J.P. et al., *Design and calibration of pulsed vapor generators for 2,4,6-trinitrotoluene, cyclo-1,3,5-trimethylene-2,4,6-trinitramine, and pentaerythritol tetranitrate*, Analytical Chemistry 1993, 65, 3004-3009.

Aarik, J. et al., *Control of thin film structure by reactant pressure in atomic layer deposition of $TiO_2$*, Journal of Crystal Growth 1996, 169, 496-502.

Chowdhury, A.I. et al., *Real-time process sensing and metrology in amorphous and selective area silicon plasma enhanced chemical vapor deposition using in situ mass spectrometry*, Journal of Vacuum Science & Technology, B 1997,15, 127-132.

Min, J. S. et al., *Atomic Layer Deposition of TiN Films by Alternate Supply of Tetrakis (ethylmethylamino)-Titanium and Ammonia*, Japanese Journal of Applied Physics, Part 1, 1998, 37, 4999-5004.

Zhou, N. et al, *CFD simulation of pulsed MOCVD to reduce gas-phase parasitic reaction*, Proceedings of SPIE 1999, 3792 , 58-72.

Dietz, N. et al., *Real-Time Optical Characterization and Control of Heteroepitaxial $Ga_xIn_{1-x}P$ Growth by P-Polarized Reflectance*, Materials Research Society Symposium Proceedings 2000, 591, 307-312.

Pedrow, P.D. et al., *Computer Controlled Pulsed PECVD Reactor for Laboratory Scale Deposition of Plasma Polymerized Thin Films*, Materials Research Society Symposium Proceedings 2000, 600, 325-331.

* cited by examiner

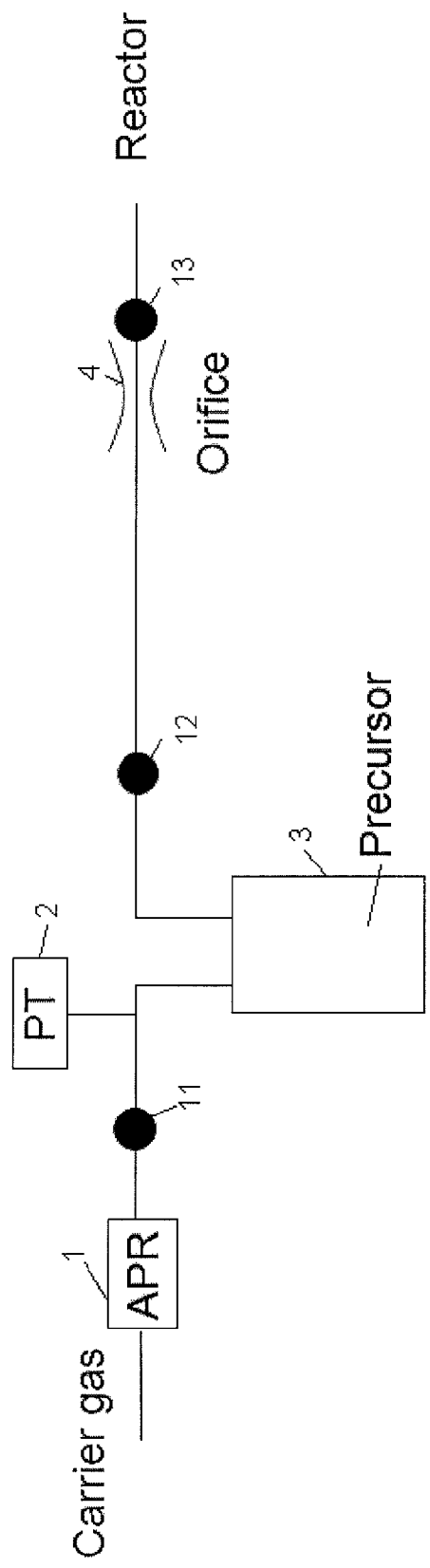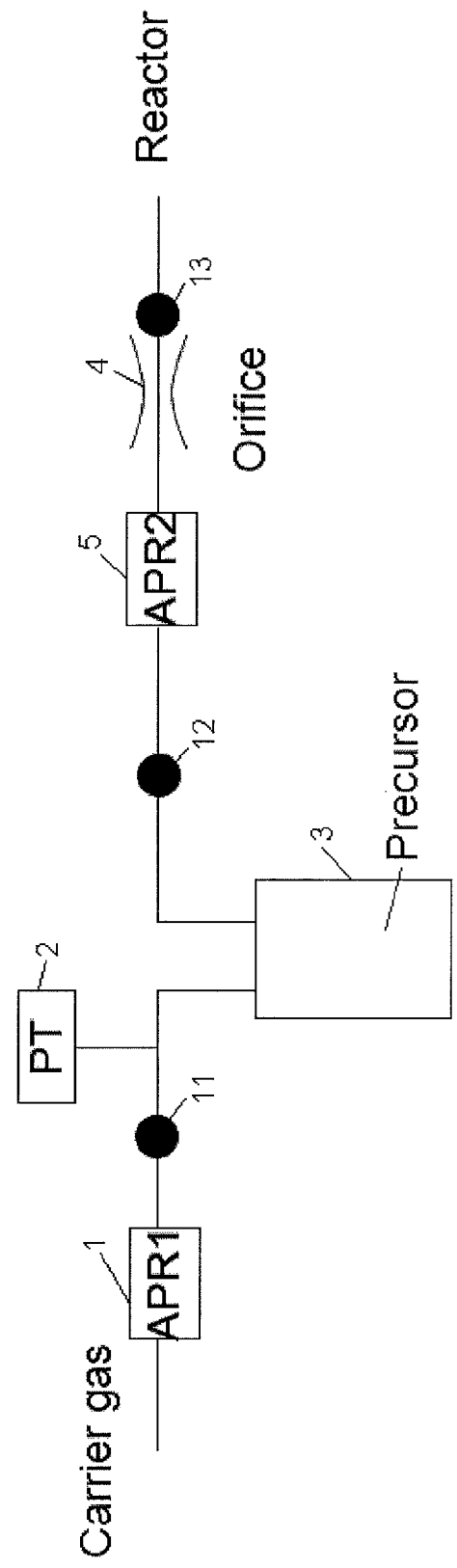
Fig. 1
Fig. 2

METHOD FOR CONTROLLING FLOW AND CONCENTRATION OF LIQUID PRECURSOR

BACKGROUND

1. Field of the Invention

The present invention relates to a method for supplying a liquid material used for deposition of a thin film by, for example, Atomic Layer Deposition (hereinafter referred to as "ALD"). In particular, the present invention relates to a method for controlling the concentration and flow rate of a material of high vapor pressure.

2. Description of the Related Art

Conventionally, film deposition by ALD is performed at short intervals of 0.1 to 1 second in order to switch the precursor and reactant by opening/closing the valves in the gas supply lines.

This presents the problem of inaccurate flow rate control by the MFC (Mass Flow Controller) used in traditional CVD, etc., due to a large fluctuation in line pressure. Under ALD, therefore, the APR (Auto Pressure Regulator) is used to maintain a constant line pressure, while an orifice, etc., provided at the entrance of the reaction chamber is used to control the flow rate. In other words, while the MFC senses heat transfer inside the controller to control the flow rate at the set level, it requires constant flow because the operating principle of the sensor in the MFC is based on heat transfer, and therefore the MFC cannot be used in ALD and other processes where gas is supplied and stopped frequently. By using the APR, however, accurate flow rate control becomes possible for liquid materials whose vapor pressure is low (not to exceed $1/10$ th the supply pressure of carrier gas).

SUMMARY

Under this method, however, the carrier gas pressure need to be changed by changing the set value of the APR in order to change the flow rate, and accordingly the material concentration changes with the flow rate. When the concentration is to be changed, on the other hand, liquid material need to be heated in an oven or cooled with a Peltier element, etc., to change the material vapor pressure.

With liquid materials of high vapor pressure, the flow rate cannot be lowered because the line pressure cannot be lowered to or below the material vapor pressure. Furthermore, the carrier gas pressure need to be increased to lower the material concentration, which causes the flow rate to rise.

According to an embodiment of the present invention intended to resolve at least one of the problems associated with conventional technologies, separate APRs are provided, one for controlling the carrier gas pressure and the other for controlling the material vapor pressure, and the two APRs are controlled separately, in order to allow for independent controls of material concentration and total flow rate (carrier gas+material).

In an embodiment, the pressure on the primary side of the APR can be raised to the APR operation compensation range by adding the carrier gas pressure, even with liquid materials whose vapor pressure is below the APR operation compensation range (such as 100 kPa or below in pressure on the primary side), and consequently the material concentration can be controlled and the line pressure can also be controlled accurately.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

FIG. 1 is a schematic view of a comparative precursor supply system.

FIG. 2 is a schematic view of a precursor supply system according to an embodiment of the present invention.

DETAILED DESCRIPTION

Figure 4:
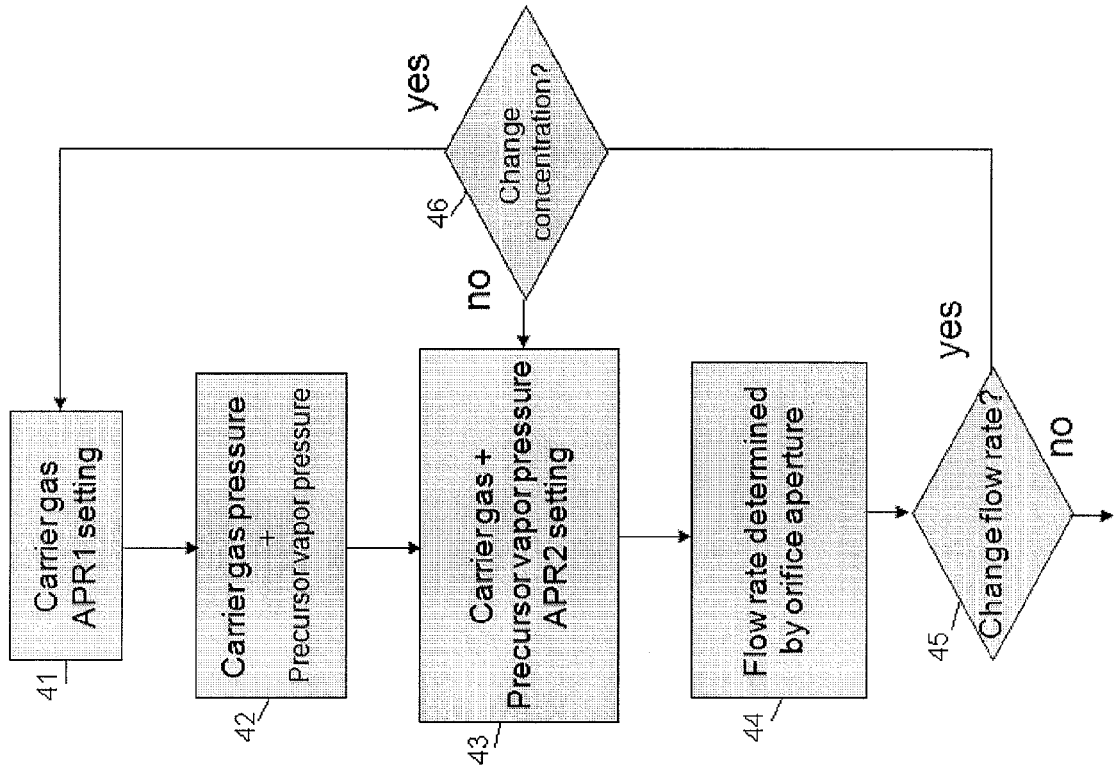
FIG. 4 is a flow chart of a precursor supply system according to an embodiment of the present invention.

The present invention will be explained below with reference to embodiments which are not intended to limit the present invention.

One of the disclosed embodiments provides a method for controlling flow and concentration of a liquid precursor, comprising: (i) supplying a carrier gas to a first auto-pressure regulator and outputting therefrom the carrier gas at a first pressure to an inlet of a precursor reservoir that stores a vaporized precursor, thereby outputting a mixture of the vaporized precursor and the carrier gas from the precursor reservoir through an outlet of the precursor reservoir, said first auto-pressure regulator being provided upstream of the precursor reservoir; and (ii) supplying the mixture of the vaporized precursor and the carrier gas to a second auto-pressure regulator and outputting therefrom the mixture at a second pressure to a reactor via an orifice, said second auto-pressure regulator being provided downstream of the precursor reservoir and said orifice being provided downstream of said second auto-pressure regulator.

In an embodiment, a concentration of the precursor in the mixture entering the reactor may be controlled and determined as a function of the first pressure, and a flow rate of the mixture entering the reactor may be controlled and determined as a function of the second pressure without substantially changing the concentration. In an embodiment, the method may further comprise, prior to (i), providing a relationship between the first pressure and the concentration of the precursor in the mixture, wherein (i) comprises controlling the first pressure based on the relationship to obtain a target concentration of the precursor in the mixture. In an embodiment, the method may further comprise, prior to (ii), providing a relationship between the second pressure and the flow rate of the mixture, wherein (ii) comprises controlling the third pressure based on the relationship to obtain a target flow rate of the mixture. In an embodiment, the target concentration of the precursor in the mixture may be obtained independently of the second pressure.

In any of the foregoing embodiments, (i) and (ii) may be performed intermittently at intervals within the range of about 0.1 to 1 seconds. In an embodiment, the precursor may be a material used for atomic layer deposition.

In any of the foregoing embodiments, the vaporized precursor may have a partial pressure of 10 kPa or higher in the precursor reservoir.

In any of the foregoing embodiments, a partial pressure of the vaporized precursor in the precursor reservoir may be controlled by a temperature of the precursor reservoir.

In any of the foregoing embodiments, during (i) and (ii), a partial pressure of the vaporized precursor in the precursor reservoir and an aperture of the orifice may be constant.

In any of the foregoing embodiments, (i) and (ii) may be performed without using mass flow controllers.

In any of the foregoing embodiments, a partial pressure of the vaporized precursor in the precursor reservoir may be higher than 1/10 of the first pressure.

In another aspect, one of the disclosed embodiments provides a method of depositing a film by atomic layer deposition, comprising: (a) supplying to the reactor the mixture according to any of the foregoing methods alternately with supplying a reactant, wherein a substrate is placed in the reactor; and (b) depositing a film on the substrate by atomic layer deposition using the mixture and the reactant.

In an embodiment, the alternate supply of the mixture and the reactant may be repeated at intervals in the range of about 0.1 to 1 seconds.

As explained above, this embodiment is effective with liquid materials used for ALD. It is because in CVD where material is supplied continuously to the reactor, the concentration and flow rate of liquid material can be controlled by, for example, supplying the material directly using one MFC and then mixing it with dilution gas controlled by a different MFC, without using the method illustrated by the aforementioned embodiment. In the case of ALD where material supply to the reactor is turned on/off frequently, on the other hand, MFCs cannot be used and therefore controlling the concentration and flow rate of liquid material using two APRs is effective. Take note, however, that plasma CVD is also available as a means for supplying material to the reactor via pulsing, and the aforementioned embodiment can be applied favorably not only to ALD, but also to processes that supply material via pulsing.

The APR is typically a regulator that maintains a set pressure using a built-in pressure sensor, while the MFC controls the flow rate at a set level by sensing heat transfer inside the controller. Because the operating principle of its sensor is based on heat transfer, the MFC requires constant flow and thus cannot be used in ALD and other processes where gas is supplied and stopped frequently. For your information, two APRs are used in an embodiment of the present invention, where the two APRs may be of the same type or different types. The two APRs can also have the same operation assurance range or different operation assurance ranges.

An embodiment of the present invention can be easily implemented and applied in ALD and pulse CVD processes by those skilled in the art.

Also, in an embodiment of the present invention, concentration and flow rate can be controlled accurately regardless of the vapor pressure of liquid material, where accurate control of concentration and flow rate is possible not only with liquid materials of low vapor pressure (10 kPa or below), such as Hexakis(ethylamino)disilane: $Si_2(NHC_2H_5)_6$ (13.3 Pa at 80° C.), Bis(diethylamido)silane: $H_2Si[N(C_2H_5)_2]_2$ (266 Pa at 25° C.), Tris(dimethylamino) silane: $Si[(CH_3)_2N]_3H$ (1 kPa at 25° C.), etc., but also to liquid materials of high vapor pressure (exceeding 10 kPa) whose concentration and flow rate could not be controlled accurately to date, such as Trisilylamine: $(SiH_3)N$ (39 kPa at 25° C.).

Take note that the aforementioned vapor pressures indicate vapor pressures at the set temperature of the precursor container. Here, the set temperature is generally subject to the following limitations. To be specific, while the vapor pressure of liquid material changes according to temperature, the usable temperature range varies with each liquid material. Also, the maximum temperature varies from one material to another due to its relationship with the decomposition temperature. In an embodiment, for example, the set temperature is adjusted in the lowering direction because it is suitable for the concentration control and flow rate control of materials of high vapor pressure. However, the adjustment range is narrower when the material temperature is lowered, compared to when it is raised, and therefore it is generally impossible to change the vapor pressure significantly, even when the temperature is lowered from room temperature of 25° C. to 0° C.

For your information, APRs generally have an operation assurance range, and a given APR cannot assure accuracy when the pressure on the primary side of the APR (before the APR) is at or below a specified value (such as 100 kPa). In an embodiment, the supply pressure of carrier gas (Ar, etc.) is from 200 to 300 kPa (meaning that the operation assurance range is met when the pressure on the primary side of the APR is between 200 and 300 kPa), while the pressure on the secondary side of the APR (after the APR) is controlled within 10 to 100 kPa. Even with liquid materials of high vapor pressure including the material cited as the example above, the vapor pressures are approx. 40 kPa, and since this is below the operation assurance range of the APR, accurate pressure control is difficult. In this case, raising the pressure to the operation assurance range of the APR using carrier gas permits appropriate pressure control. In an embodiment of the present invention, on the other hand, concentration and flow rate can be controlled accurately even when the supply pressure of carrier gas is adjusted, because the concentration is determined by the first APR (installed upstream of the precursor container) and material vapor pressure, while the flow rate is determined by the second APR (installed downstream of the precursor container).

The following explains embodiments of the present invention using FIGS. 1 and 2 as examples. It should be noted, however, that the present invention is not limited to these embodiments.

Figure 3:
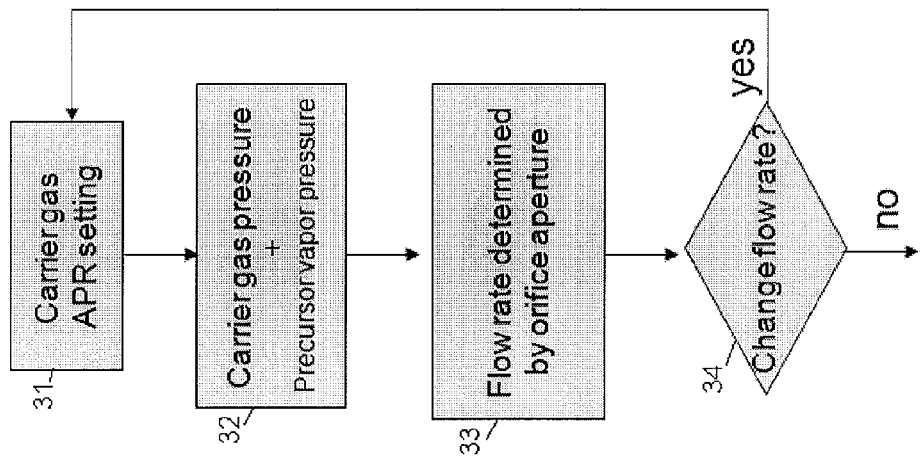
FIG. 3 is a flow chart of a comparative precursor supply system.

FIG. 1 shows a method for supplying liquid material using one APR (control method). Under this method, the carrier gas pressure is controlled by the APR1 (1) before (upstream of) the precursor container 3, and carrier gas is supplied to the precursor container 3 through the pressure transducer (PT) 2 that monitors the line pressure, after which carrier gas is discharged from the precursor container 3 together with material gas and both gases are supplied to the reaction chamber via the orifice 4. Here, the total flow rate of carrier gas and material gas is determined by the line pressure and orifice diameter. Take note that in this embodiment, the valves 11, 12 are installed between the APR1 and PT2, and between the precursor container 3 and orifice 4, respectively. Also, the pulsing valve 13 is installed downstream of the orifice so that material gas can be supplied to the reaction chamber via pulsing. The material concentration is determined by the ratio of carrier gas pressure (APR1) and material vapor pressure. Although the carrier gas pressure (set pressure of the APR1) need to be changed in order to change the flow rate, changing the set pressure of the APR1 changes not only the flow rate, but also the material concentration. FIG. 3 shows a control flow of this control method. First, the carrier gas pressure of the APR (pressure on the secondary side) is set (step 31) to determine the pressure of carrier gas entering the precursor container, after which this carrier gas pressure is added to the vapor pressure of material gas in the precursor container and carrier gas and material gas are discharged from the precursor container at the calculated total pressure (step 32), and then the flow rate is determined by the orifice diameter when the discharged carrier gas and material gas pass through the orifice (step 33). To change the flow rate (step 34), the set pressure of the APR need to be changed. As a result, the ratio of material vapor pressure and carrier gas pressure changes and consequently the material concentration changes. Under the control method, therefore, both concentration and flow rate cannot be controlled effectively.

FIG. 2 shows a method for supplying liquid material conforming to an embodiment of the invention specified in the present application for patent. The carrier gas pressure is controlled by the APR1 (1), while the total line pressure of carrier gas pressure and material vapor pressure is controlled by the APR2 (5) installed downstream of the precursor 3 but upstream of the orifice 4 in order to ensure the supply flow rate determined by the orifice diameter to the reaction chamber. As with the control method, the material concentration is determined by the ratio of carrier pressure (APR1 (1)) and material vapor pressure. However, the flow rate of supply to the reaction chamber can be changed using the APR2 (5). FIG. 4 shows a control flow of this embodiment. First, the carrier gas pressure of the APR1 (pressure on the secondary side) is set (step 41) to determine the pressure of carrier gas entering the precursor container, after which this carrier gas pressure is added to the vapor pressure of material gas in the precursor container and carrier gas and material gas are discharged from the precursor container at the calculated total pressure (step 42), and then pass through the APR2. At the APR2, the total pressure of carrier gas and material gas on the secondary side is set and this pressure setting is used to determine the total pressure of carrier gas and material gas entering the orifice (step 43). Next, the flow rate is determined by the orifice diameter when the discharged carrier gas and material gas pass through the orifice (step 44). To change the flow rate (step 45), only the flow rate can be changed without changing the material concentration, by changing the set pressure of the APR2, if the material concentration should not be changed (step 46). If the material concentration is also changed (step 46), the set pressure of the APR1 is changed. As a result, the ratio of material vapor pressure and carrier gas pressure changes and consequently the material concentration changes. Based on this method, concentration and flow rate can be controlled effectively at desired levels, respectively, due to step 46.

In an embodiment, an orifice with a fixed diameter is used. For example, an orifice comprising a VCR gasket (of approx. 0.3 mm thickness) having a hole of approx. 500 µm can be used to minimize the dead space on the secondary side of the orifice. If an orifice with a variable diameter is used, on the other hand, a dead space is created between the orifice-diameter varying means and the reactor valve, which makes it difficult to control the flow rate—a function required in ALD. Accordingly, it is desirable to use a fixed orifice and two APRs. Also note that in an embodiment, there is virtually no other structure designed to control the flow rate (affect the pressure control by the APR1) between the APR1 and precursor container, nor is there virtually any structure designed to control the flow rate (affect the pressure control by the APR2) among the precursor, APR2 and orifice. In other words, in an embodiment the gas exiting the APR 1 immediately (directly) enters the precursor container, the gas existing the precursor container immediately (directly) enters the APR2, and the gas exiting the APR2 immediately (directly) enters the orifice.

Figure 7:
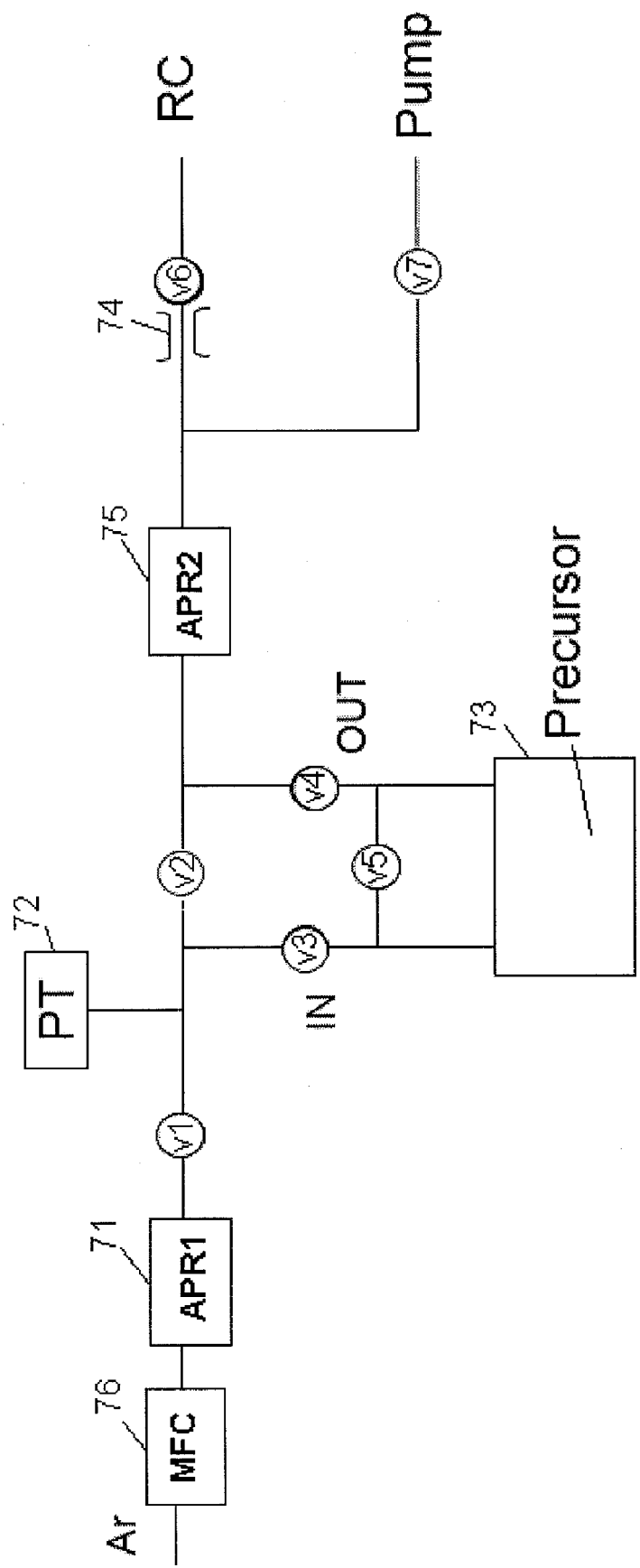
FIG. 7 is a schematic view of a precursor supply system according to another embodiment of the present invention.

FIG. 7 shows a pulsed gas supply system used in a different embodiment. This system controls the carrier gas pressure using the APR1 (71) before (upstream of) the precursor container 73, and carrier gas is supplied to the precursor container 73 through the pressure transducer (PT) 72 that monitors the line pressure, after which carrier gas is discharged from the precursor container 73 together with material gas and the two gases are supplied to the reaction chamber through the APR2 (75) and also through the orifice 74. As with the system shown in FIG. 2, the carrier gas pressure is controlled by the APR1 (1) 71 to permit control of material concentration, while the carrier gas+material vapor pressure is controlled by the APR2 (75) to permit control of flow rate. In this embodiment, the MFC 76 is installed upstream of the APR1 (71). Although a MFC alone cannot support pulsed material supply, it can be combined with an APR (by placing the MFC upstream of the APR). Also, a MFC can be used to supply gas without pulsing and then calculate K (coefficient), in order to correct the difference between calculated and actual flow rates (caused by pressure loss, etc.), orifice diameter error, and so on. In addition, the valves v1 to v7 are also provided in this figure. The line having v2 and v5 is a bypass line. v6 is a pulsing valve, while v7 is used to relieve gas from the line. The flow rate of supply to the reaction chamber can be calculated by the formula below:

$$\text{Flow rate} = P \times D^2 \times K / \sqrt{MW\text{gas}}$$

Here, $K=4.81e-4$, MWgas: Molecular weight of gas, Flow rate: Flow rate (sccm), P=(Pressure on the secondary side of the APR1+Precursor vapor pressure) (kPa), and D: Orifice diameter (µm).

Figure 8:
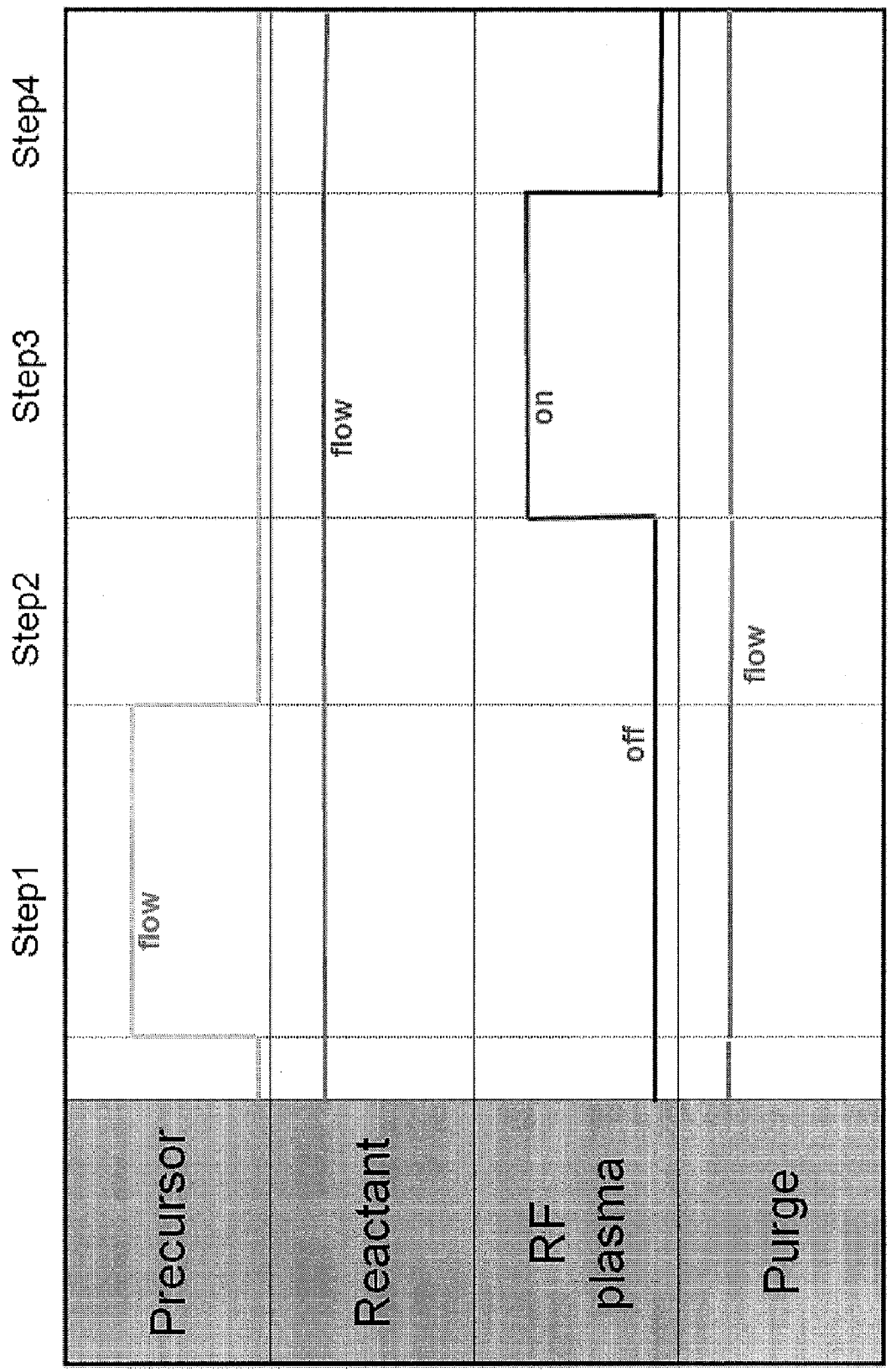
FIG. 8 is a chart showing steps for performing ALD according to an embodiment of the present invention.

FIGS. 7 and 8 are used to explain the pulsed supply of material to the reaction chamber and the ALD steps. Table 1 lists the opened/closed state of each valve in each step.

TABLE 1

| | v1 | v2 | v3 | V4 | v5 | v6 | v7 |
|---|---|---|---|---|---|---|---|
| Stand by | closed | closed | closed | closed | closed | closed | closed |
| Pre-In | opened | closed | opened | opened | closed | closed | closed |
| Step 1 | opened | closed | opened | opened | closed | opened | closed |
| Step 2 | opened | closed | opened | opened | closed | closed | closed |
| Step 3 | opened | closed | opened | opened | closed | closed | closed |
| Step 4 | opened | closed | opened | opened | closed | closed | closed |

In the standby step, all valves are closed. In the Pre-In (Precursor In) step, all valves up to upstream of the pulsing valve v6 being provided downstream of the orifice are opened (except for the bypass valves v2 and v5 and gas relief valve v7 which are closed). In step 1, v6 is opened to implement pulsed supply of material for one cycle, and material is supplied to the reaction chamber. Next in step 2, v6 is closed to purge the reaction chamber, and in step 3 RF is applied in the reaction chamber to which reactant is supplied to generate oxygen plasma, etc., in order to cause material to react with precursor on the substrate. Next in step 4, the reaction chamber is purged. FIG. 8 shows one cycle consisting of the aforementioned steps. In the case of plasma enhanced ALD, as shown in this example, reaction does not occur unless plasma is applied and thus a constant reactant flow is maintained. In addition, the purge gas flow is also constant at all times and therefore when the precursor supply is stopped, the reaction chamber is purged by the flow of purge gas. It should be noted that an embodiment of the present invention can be widely applied not only to PE (Plasma Enhanced) ALD mentioned above, but also to other processes such as thermal ALD and pulsed CVD where liquid material is gasified and then supplied to the reaction chamber via pulsing.

Figure 5:
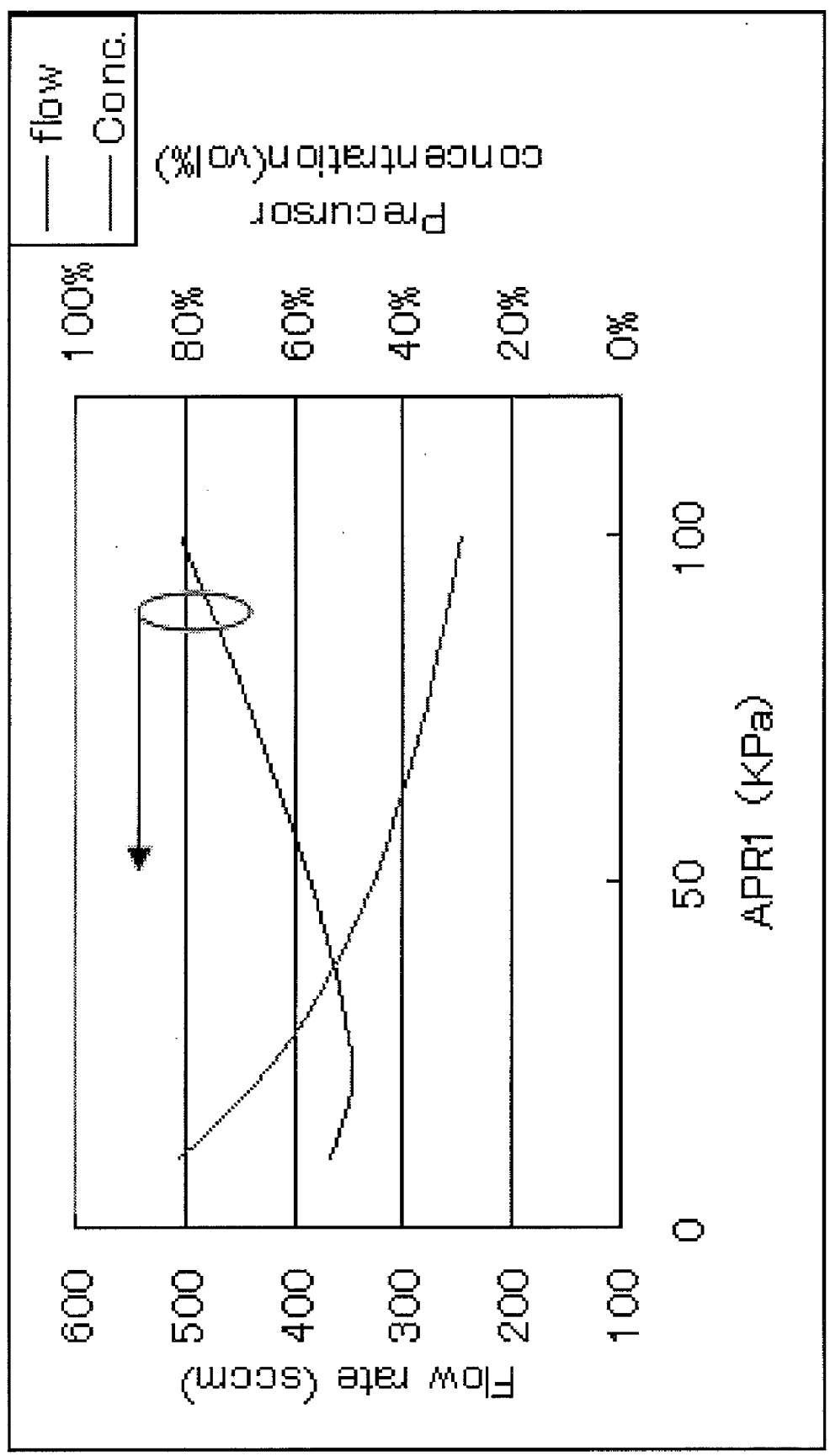
FIG. 5 is a graph showing the relationship between flow rate and set pressure of auto-pressure regulator (APR) and the relationship between precursor concentration and set pressure of APR in a comparative precursor supply system.
Figure 6:
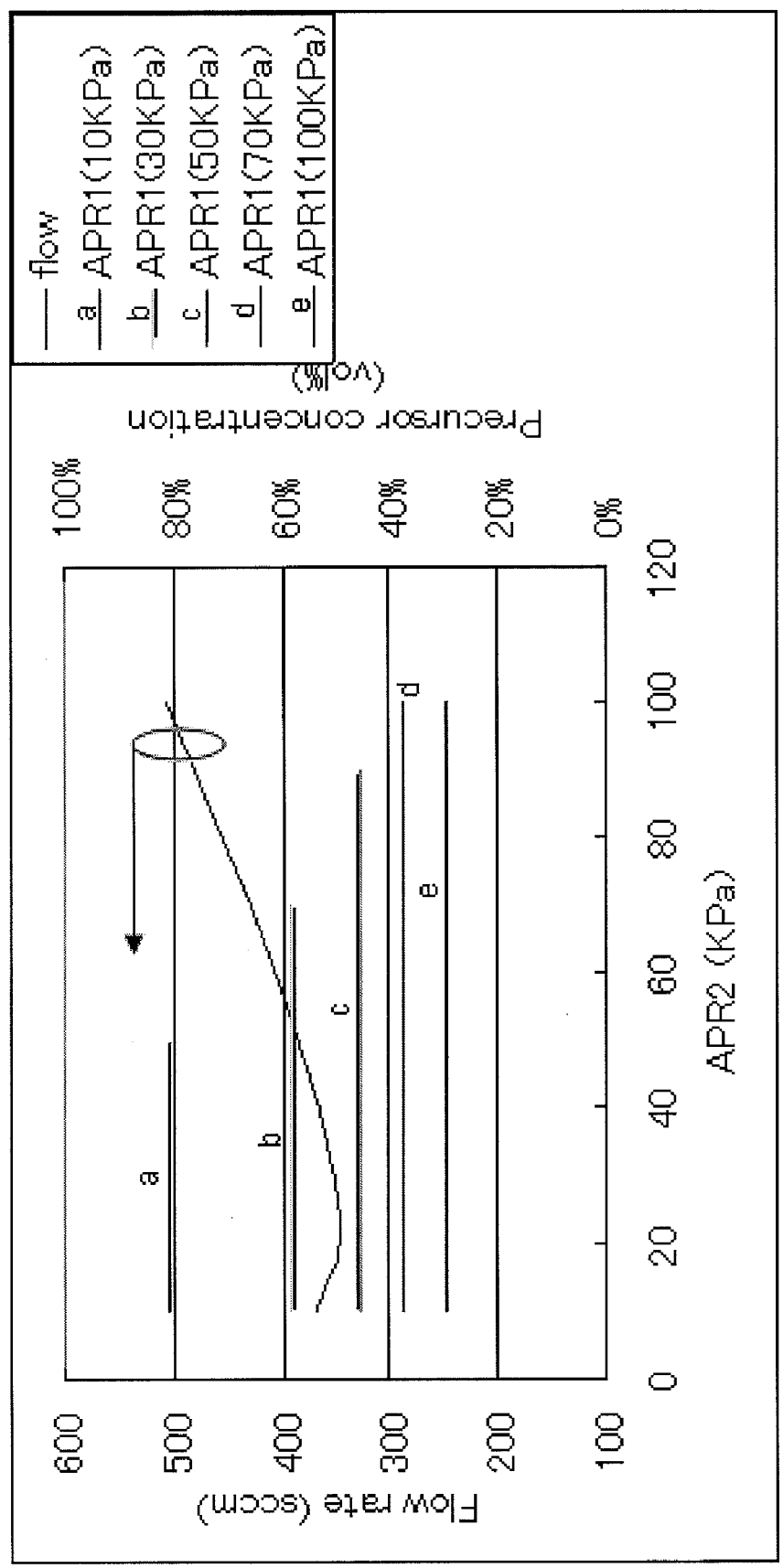
FIG. 6 is a graph showing the relationship between flow rate and set pressure of APR 2 and the relationship between precursor concentration and set pressure of APR 2 as a function of set pressure of APR 1 in a precursor supply system according to an embodiment of the present invention.

Next, FIGS. 5 and 6 show the control ranges of concentration and flow rate when TSA (Trisilylamine) of medium vapor pressure is supplied to the reaction chamber using the method illustrated in this embodiment of the present invention. For your information, the temperature of liquid material (TSA) was adjusted to room temperature (25° C.), while the orifice diameter was adjusted to 500 μm. TSA had a Mw of 107.4 and vapor pressure of 43 kPa at 25° C., while Ar with an Aw (atomic weight) of 39.94 was used as carrier gas. The APR adjustment range was 10 to 100 kPa (the supply pressure before the APR was 100 kPa or above, or normally in a range of approx. 150 to 300 kPa).

As shown in FIG. 5, the control method using one APR allowed the flow rate to increase by means of increasing the set pressure (pressure on the secondary side) of the APR1. However, the material concentration dropped at the same time. In this example, changing the set pressure from approx. 10 kPa to approx. 100 kPa caused the flow rate to increase from approx. 350 sccm to approx. 500 sccm, while the material concentration dropped from approx. 80% to approx. 30%. These results suggest that flow rate and concentration cannot be controlled separately.

On the other hand, FIG. 6 illustrates the embodiment using two APRs including the APR1 and APR2. When the set pressure (pressure on the secondary side) of the APR2 was increased (from 10 kPa to 100 kPa), the flow rate increased from approx. 350 sccm to approx. 500 sccm, as was the case with the APR1. However, the material concentration did not change. As for the material concentration, the concentration determined by the set pressure of the APR1 was unchanged and supplied to the reaction chamber. This indicates that, for example, by setting the APR1 pressure to approx. 30 kPa and APR2 pressure to approx. 60 kPa, a flow rate of 400 sccm can be achieved at a material concentration of 60%. Furthermore, setting the APR2 pressure to approx. 80 kPa would increase the flow rate to 450 sccm while keeping the material concentration unchanged at 60%. By creating these charts beforehand, concentration and flow rate can be controlled separately and accurately.

As explained above, the method for supplying liquid material according to an embodiment of the present invention allows flow rate and material concentration to be controlled independently, which even allows for control of liquid materials of high vapor pressure at low concentrations and low flow rates. Since liquid materials used for ALD are expensive, this method also eliminates material wastage in the supply process and therefore helps provide a low CoO (Cost of Ownership) process. To be specific, the cost per wafer is important for manufacturing apparatuses used at semiconductor factories, where the CoO of concern includes consumptions of materials and other substances needed to deposit film on a single wafer. Accordingly a system that does not require wasteful gas consumptions, or consumptions not contributing to deposition, is effective in keeping the CoO low.

In the present disclosure where conditions and/or structures are not specified, the skilled artisan in the art can readily provide such conditions and/or structures, in view of the present disclosure, as a matter of routine experimentation.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for controlling flow and concentration of a liquid precursor, comprising:

supplying a carrier gas to a first auto-pressure regulator and outputting therefrom the carrier gas at a first pressure to an inlet of a precursor reservoir that stores a liquid and vaporized precursor, thereby outputting a mixture of the vaporized precursor and the carrier gas from the precursor reservoir through an outlet of the precursor reservoir, said first auto-pressure regulator being provided upstream of the precursor reservoir; and supplying the mixture of the vaporized precursor and the carrier gas to a second auto-pressure regulator and outputting therefrom the mixture at a second pressure to a reactor via an orifice, said second auto-pressure regulator being provided downstream of the precursor reservoir and said orifice being provided downstream of said second auto-pressure regulator, wherein the first and second auto-pressure regulators are each a regulator that maintains a set pressure using a built-in pressure sensor.

2. The method according to claim 1, wherein a concentration of the precursor in the mixture entering the reactor is controlled and determined as a function of the first pressure, and a flow rate of the mixture entering the reactor is controlled and determined as a function of the second pressure without substantially changing the concentration.

3. The method according to claim 2, further comprising, prior to supplying the carrier gas, providing a relationship between the first pressure and the concentration of the precursor in the mixture, wherein supplying the carrier gas comprises controlling the first pressure based on the relationship to obtain a target concentration of the precursor in the mixture.

4. The method according to claim 3, further comprising, prior supplying the mixture, providing a relationship between the second pressure and the flow rate of the mixture, wherein supplying the mixture comprises controlling the second pressure based on the relationship to obtain a target flow rate of the mixture.

5. The method according to claim 3, wherein the target concentration of the precursor in the mixture is obtained independently of the second pressure.

6. The method according to claim 1, wherein supplying the carrier gas and supplying the mixture are performed repeatedly and intermittently at intervals in the range of about 0.1 to 1 seconds.

7. The method according to claim 6, wherein the precursor is a material used for atomic layer deposition.

8. The method according to claim 1, wherein the vaporized precursor has a partial pressure of 10 kPa or higher in the precursor reservoir.

9. The method according to claim 1, wherein a partial pressure of the vaporized precursor in the precursor reservoir is controlled by a temperature of the precursor reservoir.

10. The method according to claim 1, wherein during supplying the carrier gas and supplying the mixture, a partial pressure of the vaporized precursor in the precursor reservoir and an aperture of the orifice are constant.

11. The method according to claim 1, wherein supplying the carrier gas and supplying the mixture are performed without using mass flow controllers.

12. The method according to claim 1, wherein a partial pressure of the vaporized precursor in the precursor reservoir is higher than $1/10$ of the first pressure.

13. A method of depositing a film by atomic layer deposition, comprising:
supplying to the reactor the mixture according to claim 1 alternately with supplying a reactant to the reactor, wherein a substrate is placed in the reactor; and depositing a film on the substrate by atomic layer deposition using the mixture and the reactant.

14. The method according to claim 13, wherein the alternate supply of the mixture and the reactant is repeated at intervals in the range of about 0.1 to 1 seconds.

* * * * *